(12) United States Patent
Wada et al.

(10) Patent No.: US 11,004,941 B2
(45) Date of Patent: *May 11, 2021

(54) SILICON CARBIDE EPITAXIAL SUBSTRATE HAVING GROOVES EXTENDING ALONG MAIN SURFACE AND METHOD OF MANUFACTURING SILICON CARBIDE SEMICONDUCTOR DEVICE

(71) Applicant: Sumitomo Electric Industries, Ltd., Osaka (JP)

(72) Inventors: Keiji Wada, Itami (JP); Hironori Itoh, Itami (JP); Taro Nishiguchi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/986,402

(22) Filed: Aug. 6, 2020

(65) Prior Publication Data

US 2020/0365693 A1  Nov. 19, 2020

Related U.S. Application Data

(63) Continuation of application No. 16/660,878, filed on Oct. 23, 2019, now Pat. No. 10,770,550, which is a (Continued)

(30) Foreign Application Priority Data

Nov. 24, 2015  (JP) ............................. JP2015-228601

(51) Int. Cl.
*H01L 29/16* (2006.01)
*C30B 25/20* (2006.01)
(Continued)

(52) U.S. Cl.
CPC .......... *H01L 29/1608* (2013.01); *C30B 25/20* (2013.01); *C30B 29/36* (2013.01);
(Continued)

(58) Field of Classification Search
CPC ..... H01L 29/32; H01L 29/34; H01L 29/1608; H01L 29/7802; H01L 29/7813;
(Continued)

(56) References Cited

U.S. PATENT DOCUMENTS 6,235,547 B1  5/2001  Sakuma et al.
6,849,875 B2  2/2005  Ishida
(Continued)

FOREIGN PATENT DOCUMENTS

JP  2014-170891 A  9/2014

*Primary Examiner* — Khiem D Nguyen
(74) *Attorney, Agent, or Firm* — Baker Botts L.L.P.; Michael A. Sartori

(57) ABSTRACT

A silicon carbide epitaxial substrate has a silicon carbide single-crystal substrate and a silicon carbide layer. An average value of carrier concentration in the silicon carbide layer is not less than $1 \times 10^{15}$ cm$^{-3}$ and not more than $5 \times 10^{16}$ cm$^{-3}$. In-plane uniformity of the carrier concentration is not more than 2%. The second main surface has: a groove 80 extending in one direction along the second main surface, a width of the groove in the one direction being twice or more as large as a width thereof in a direction perpendicular to the one direction, and a maximum depth of the groove from the second main surface being not more than 10 nm; and a carrot defect. A value obtained by dividing a number of the carrot defects by a number of the grooves is not more than 1/500.

12 Claims, 11 Drawing Sheets

Related U.S. Application Data continuation of application No. 15/762,147, filed as application No. PCT/JP2016/074455 on Aug. 23, 2016, now Pat. No. 10,490,634.

(51) Int. Cl.

| | |
|---|---|
| *C30B 29/36* | (2006.01) |
| *H01L 21/02* | (2006.01) |
| *H01L 29/66* | (2006.01) |
| *H01L 21/20* | (2006.01) |
| *H01L 21/205* | (2006.01) |
| *H01L 29/12* | (2006.01) |
| *H01L 29/161* | (2006.01) |
| *H01L 29/78* | (2006.01) |
| *H01L 29/34* | (2006.01) |

(52) U.S. Cl.
CPC .... *H01L 21/0262* (2013.01); *H01L 21/02378* (2013.01); *H01L 21/02433* (2013.01); *H01L 21/02529* (2013.01); *H01L 21/02576* (2013.01); *H01L 21/20* (2013.01); *H01L 21/205* (2013.01); *H01L 29/12* (2013.01); *H01L 29/161* (2013.01); *H01L 29/34* (2013.01); *H01L 29/66068* (2013.01); *H01L 29/78* (2013.01)

(58) Field of Classification Search
CPC ............ H01L 29/872; H01L 29/66068; H01L 21/02378; H01L 21/02529; H01L 21/02433; H01L 21/02447; C30B 25/18; C30B 25/20; C30B 25/186; C30B 23/02; C30B 23/025; C30B 29/36
See application file for complete search history.

(56) References Cited

U.S. PATENT DOCUMENTS

| | | | |
|---|---|---|---|
| 7,956,383 B2 | 6/2011 | Kuroda et al. | |
| 8,350,270 B2* | 1/2013 | Watanabe | H01L 29/0878 257/77 |
| 8,981,385 B2 | 3/2015 | Wada et al. | |
| 9,117,740 B2 | 8/2015 | Yano et al. | |
| 9,117,758 B2* | 8/2015 | Ishibashi | H01L 21/28 |
| 9,178,111 B2 | 11/2015 | Tajima et al. | |
| 10,490,634 B2* | 11/2019 | Wada | H01L 21/02529 |
| 10,770,550 B2* | 9/2020 | Wada | C30B 29/36 |
| 2001/0038108 A1 | 11/2001 | Kitabatake et al. | |
| 2010/0072515 A1 | 3/2010 | Park et al. | |
| 2010/0233433 A1 | 9/2010 | Miyanaga et al. | |
| 2011/0306181 A1* | 12/2011 | Sasaki | H01L 29/7813 438/459 |
| 2012/0018740 A1 | 1/2012 | Takahashi et al. | |
| 2012/0056202 A1* | 3/2012 | Wada | C30B 29/36 257/77 |
| 2012/0080659 A1 | 4/2012 | Ueno et al. | |
| 2014/0008717 A1 | 1/2014 | Neber et al. | |
| 2015/0263086 A1* | 9/2015 | Mizukami | H01L 29/861 257/77 |
| 2015/0279940 A1 | 10/2015 | Yamada et al. | |
| 2015/0333126 A1 | 11/2015 | Fukui et al. | |
| 2015/0357415 A1* | 12/2015 | Kagawa | H01L 29/0623 |
| 2016/0005605 A1* | 1/2016 | Nishio | H01L 29/6606 |
| 2016/0032486 A1 | 2/2016 | Ansen et al. | |
| 2016/0118250 A1 | 4/2016 | Tamaso | |
| 2016/0260798 A1 | 9/2016 | Rupp et al. | |
| 2016/0326668 A1 | 11/2016 | Nishiguchi et al. | |

\* cited by examiner

US 11,004,941 B2
// 1

SILICON CARBIDE EPITAXIAL SUBSTRATE HAVING GROOVES EXTENDING ALONG MAIN SURFACE AND METHOD OF MANUFACTURING SILICON CARBIDE SEMICONDUCTOR DEVICE

TECHNICAL FIELD

The present disclosure relates to a silicon carbide epitaxial substrate and a method of manufacturing a silicon carbide semiconductor device. The present application claims priority to Japanese Patent Application No. 2015-228601 filed on Nov. 24, 2015, the entire contents of which are incorporated herein by reference.

BACKGROUND ART

Japanese Patent Laying-Open No. 2014-170891 (PTD 1) discloses a method of epitaxially growing a silicon carbide layer on a silicon carbide single-crystal substrate.

CITATION LIST

Patent Document

PTD 1: Japanese Patent Laying-Open No. 2014-170891

SUMMARY OF INVENTION

A silicon carbide epitaxial substrate according to the present disclosure includes a silicon carbide single-crystal substrate and a silicon carbide layer. The silicon carbide single-crystal substrate includes a first main surface. The silicon carbide layer is on the first main surface. The silicon carbide layer includes a second main surface opposite to a surface thereof in contact with the silicon carbide single-crystal substrate. An average value of carrier concentration in the silicon carbide layer is not less than $1\times10^{15}$ cm$^{-3}$ and not more than $5\times10^{16}$ cm$^{-3}$. In-plane uniformity of the carrier concentration is not more than 2%. The second main surface has: a groove extending in one direction along the second main surface, a width of the groove in the one direction being twice or more as large as a width thereof in a direction perpendicular to the one direction, and a maximum depth of the groove from the second main surface being not more than 10 nm; and a carrot defect. A value obtained by dividing a number of the carrot defects by a number of the grooves is not more than 1/500.

DESCRIPTION OF EMBODIMENTS

Figure 1:
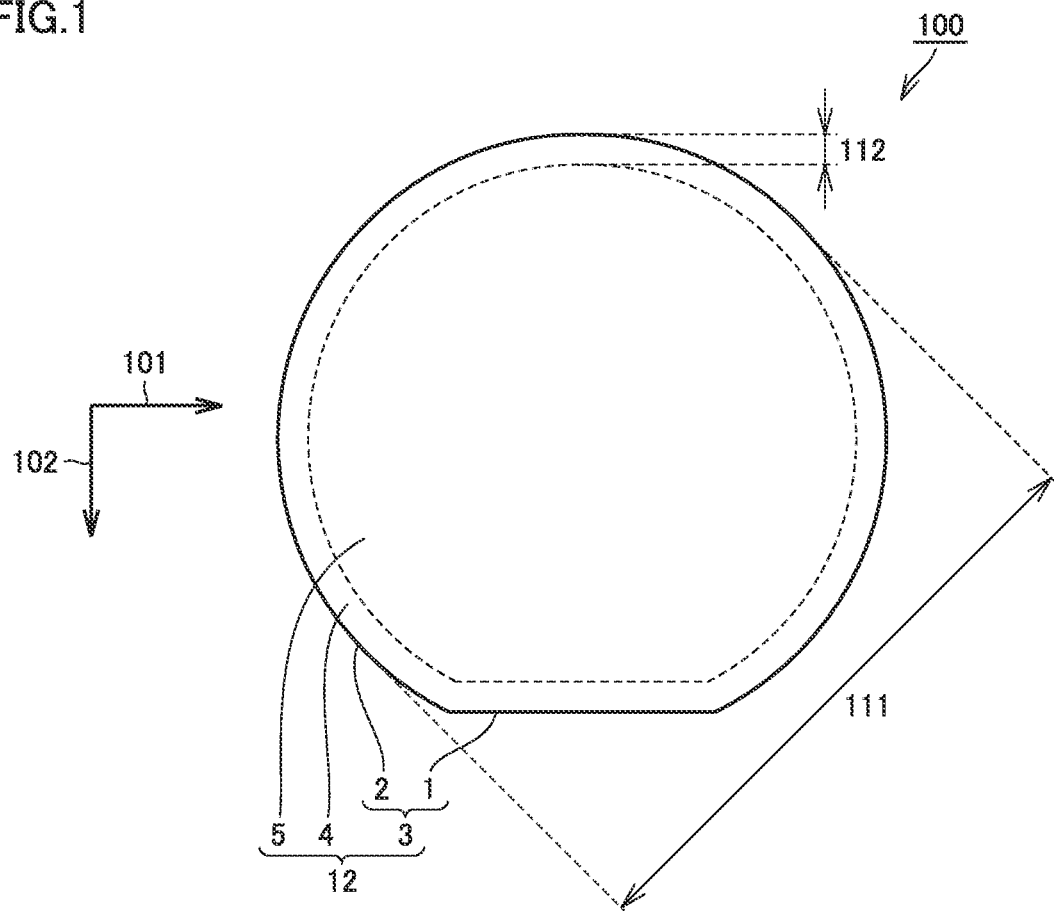
FIG. 1 is a schematic plan view showing the configuration of a silicon carbide epitaxial substrate according to the present embodiment.

[Overview of Embodiment of the Present Disclosure]

An overview of an embodiment of the present disclosure is described first. In the following description, the same or corresponding elements are designated by the same symbols and the same description thereof will not be repeated. Regarding crystallographic indications herein, an individual orientation is represented by [ ], a group orientation is represented by < >, an individual plane is represented by ( ), and a group plane is represented by { }. Although a crystallographically negative index is normally expressed by a number with a bar "–" thereabove, a negative sign herein precedes a number to indicate a crystallographically negative index.

(1) A silicon carbide epitaxial substrate 100 according to the present disclosure includes a silicon carbide single-crystal substrate 10 and a silicon carbide layer 20. Silicon carbide single-crystal substrate 10 includes a first main surface 11. Silicon carbide layer 20 is on first main surface 11. Silicon carbide layer 20 includes a second main surface 12 opposite to a surface 14 thereof in contact with silicon carbide single-crystal substrate 10. An average value of carrier concentration in silicon carbide layer 20 is not less than $1\times10^{15}$ cm$^{-3}$ and not more than $5\times10^{16}$ cm$^{-3}$. In-plane uniformity of the carrier concentration is not more than 2%. Second main surface 12 has: a groove 80 extending in one direction along second main surface 12, a width of the groove in the one direction being twice or more as large as a width thereof in a direction perpendicular to the one direction, and a maximum depth of the groove from the second main surface being not more than 10 nm; and a carrot defect 90. A value obtained by dividing a number of carrot defects 90 by a number of grooves 80 is not more than 1/500.

Usually, a plurality of threading screw dislocations are present in a silicon carbide single-crystal substrate. When forming a silicon carbide layer on a silicon carbide single-crystal substrate by epitaxial growth, threading screw dislocations present in the silicon carbide single-crystal substrate are transferred to the silicon carbide layer. Controlling the conditions for the epitaxial growth allows most of the threading screw dislocations transferred to the silicon carbide layer to appear as minute pits at a surface of the silicon carbide layer. On the other hand, some of the threading screw dislocations transferred to the silicon carbide layer change the direction in which they extend due to thermal fluctuations and the like during the epitaxial growth, for example, and appear as carrot defects at the surface of the silicon carbide layer. The carrot defects cause deterioration in breakdown voltage of a silicon carbide semiconductor device, whereas the minute pits have little effect on breakdown voltage.

As a result of research, the inventors found that a method described later allows most of threading screw dislocations to appear as minute pits at a surface of a silicon carbide layer, and can suppress the appearance of the threading screw dislocations as carrot defects at the surface. Accordingly, a silicon carbide epitaxial substrate in which a value obtained by dividing the number of carrot defects by the number of grooves (also referred to as minute pits hereinafter) is not more than 1/500 can be provided. As a result, deterioration in breakdown voltage of a silicon carbide semiconductor device manufactured with this silicon carbide epitaxial substrate can be suppressed.

(2) In silicon carbide epitaxial substrate 100 according to (1) above, groove 80 may include a first groove portion 81 and a second groove portion 82 provided continuously with first groove portion 81. First groove portion 81 is at one end portion of the groove in the one direction. Second groove portion 82 may extend from first groove portion 81 along the one direction to the other end portion opposite to the one end portion, and have a depth from second main surface 12 which is smaller than a maximum depth of first groove portion 81.

(3) In silicon carbide epitaxial substrate 100 according to (1) or (2) above, the value obtained by dividing the number of carrot defects 90 by the number of grooves 80 may be not more than 1/1000.

(4) In silicon carbide epitaxial substrate 100 according to (3) above, the value obtained by dividing the number of carrot defects 90 by the number of grooves 80 may be not more than 1/5000.

(5) In silicon carbide epitaxial substrate 100 according to any one of (1) to (4) above, a density of carrot defects 90 in second main surface 12 may be not more than 1 $cm^{-2}$.

(6) In silicon carbide epitaxial substrate 100 according to (5) above, the density of carrot defects 90 may be not more than 0.5 $cm^{-2}$.

(7) In silicon carbide epitaxial substrate 100 according to (6) above, the density of carrot defects 90 may be not more than 0.1 $cm^{-2}$.

(8) A method of manufacturing a silicon carbide semiconductor device 300 according to the present disclosure includes the following steps. Silicon carbide epitaxial substrate 100 according to any one of (1) to (7) above is prepared. Silicon carbide epitaxial substrate 100 is processed.

[Details of Embodiment of the Present Disclosure]

The details of the embodiment of the present disclosure are now described.

(Silicon Carbide Epitaxial Substrate)

Figure 2:
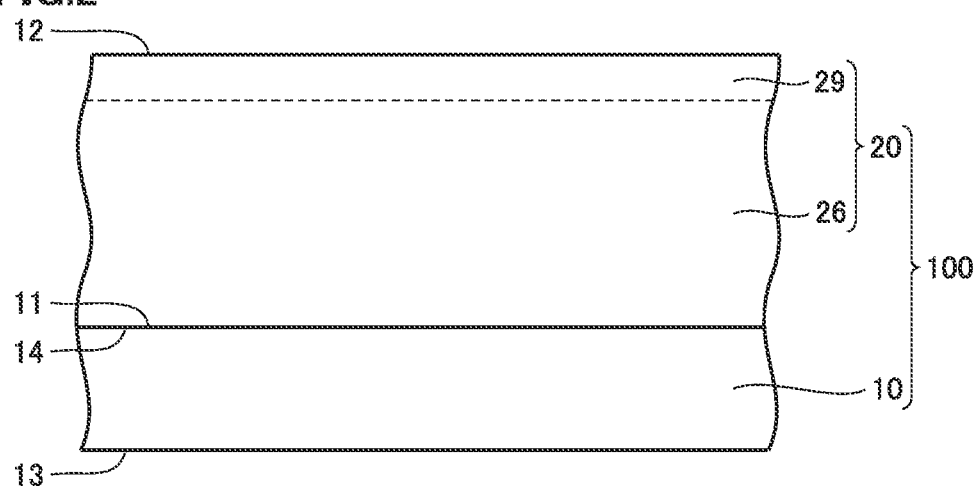
FIG. 2 is a schematic sectional view showing the configuration of the silicon carbide epitaxial substrate according to the present embodiment.

As shown in FIGS. 1 and 2, a silicon carbide epitaxial substrate 100 according to the present embodiment has a silicon carbide single-crystal substrate 10 and a silicon carbide layer 20. Silicon carbide single-crystal substrate 10 includes a first main surface 11, and a third main surface 13 opposite to first main surface 11. Silicon carbide layer 20 includes a fourth main surface 14 in contact with silicon carbide single-crystal substrate 10, and a second main surface 12 opposite to fourth main surface 14. As shown in FIG. 1, silicon carbide epitaxial substrate 100 may have a first flat 1 extending in a first direction 101. Silicon carbide epitaxial substrate 100 may have a second flat (not shown) extending in a second direction 102. First direction 101 is a <11-20> direction, for example. Second direction 102 is a <1-100> direction, for example.

Silicon carbide single-crystal substrate 10 (which may be abbreviated as "single-crystal substrate" hereinafter) is made of a silicon carbide single crystal. This silicon carbide single crystal has a polytype of 4H—SiC, for example. The 4H—SiC has better electron mobility, dielectric breakdown electric field strength and the like than other polytypes. Silicon carbide single-crystal substrate 10 includes an n type impurity such as nitrogen. Silicon carbide single-crystal substrate 10 has n type conductivity, for example. First main surface 11 is a {0001} plane or a plane tilted not more than 8° from the {0001} plane, for example. When first main surface 11 is tilted from the {0001} plane, a tilt direction of the normal of first main surface 11 is the <11-20> direction, for example.

Silicon carbide layer 20 is an epitaxial layer formed on silicon carbide single-crystal substrate 10. Silicon carbide layer 20 is on first main surface 11. Silicon carbide layer 20 is in contact with first main surface 11. Silicon carbide layer 20 includes an n type impurity such as nitrogen (N). Silicon carbide layer 20 has n type conductivity, for example. The concentration of the n type impurity included in silicon carbide layer 20 may be lower than the concentration of the n type impurity included in silicon carbide single-crystal substrate 10. As shown in FIG. 1, second main surface 12 has a maximum diameter 111 (diameter) of not less than 100 mm, for example. The diameter of maximum diameter 111 may be not less than 150 mm, not less than 200 mm, or not less than 250 mm. The upper limit of maximum diameter 111 is not particularly limited. The upper limit of maximum diameter 111 may be 300 mm, for example.

Second main surface 12 may be a {0001} plane or a plane tilted not more than 8° from the {0001} plane, for example. Specifically, second main surface 12 may be a (0001) plane or a plane tilted not more than 8° from the (0001) plane. Alternatively, second main surface 12 may be a (000-1) plane or a plane tilted not more than 8° from the (000-1) plane. A tilt direction (off direction) of the normal of second main surface 12 may be a <11-20> direction, for example. A tilt angle (off angle) from the {0001} plane may be not less than 1°, or not less than 2°. The off angle may be not more than 7°, or not more than 6°.

(In-Plane Uniformity of Carrier Concentration)

Silicon carbide layer 20 includes nitrogen, for example, as a dopant. An average value of carrier concentration in silicon carbide layer 20 is not less than $1\times10^{15}$ $cm^{-3}$ and not more than $5\times10^{16}$ $cm^{-3}$. The average value of the carrier concentration may be not more than $2\times10^{16}$ $cm^{-3}$, not more than $1\times10^{16}$ $cm^{-3}$, not more than $9\times10^{15}$ $cm^{-3}$, or not more than $8 \times 10^{15}$ cm$^{-3}$. The average value of the carrier concentration may be not less than $5 \times 10^{15}$ cm$^{-3}$, or not less than $6 \times 10^{15}$ cm$^{-3}$, for example.

The carrier concentration as used herein means an effective carrier concentration. If the silicon carbide layer includes a donor and an acceptor, for example, the effective carrier concentration is calculated as an absolute value of the difference between a donor concentration ($N_d$) and an acceptor concentration ($N_a$) ($|N_d-N_a|$).

In-plane uniformity of the carrier concentration in silicon carbide layer 20 is not more than 2%. The in-plane uniformity of the carrier concentration is a ratio (σ/ave) of a standard deviation of the carrier concentration to an average value of the carrier concentration in silicon carbide layer 20 in a direction parallel to second main surface 12. The in-plane uniformity of the carrier concentration may be not more than 1.5%, or not more than 1%.

Figure 3:
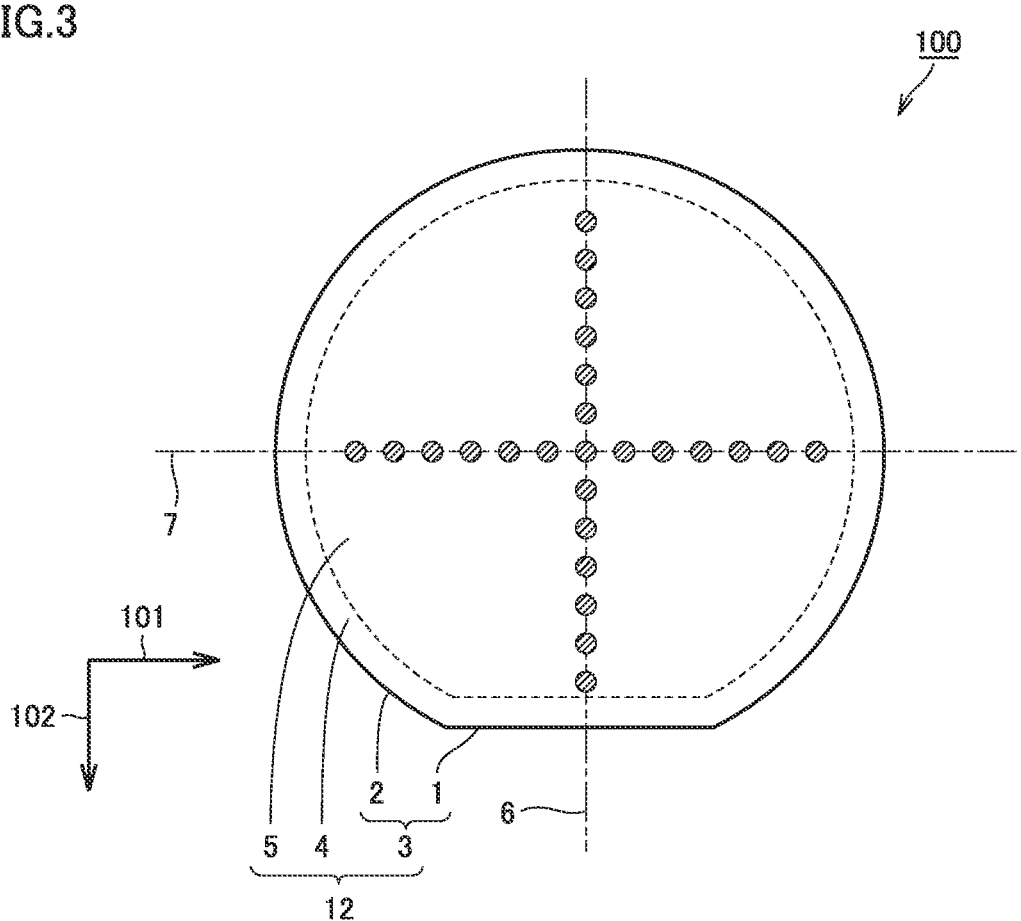
FIG. 3 is a schematic plan view showing measurement positions of carrier concentration according to the present embodiment.

Next, a method of measuring the carrier concentration is described. The carrier concentration is measured by a mercury probe type C-V measurement device, for example. The probe has an area of 0.01 cm$^2$, for example. Second main surface 12 includes an outer edge 3, an outer circumferential region 4, and a central region 5. Outer edge 3 has linear first flat 1 and a curvature portion 2. Outer circumferential region 4 is a region within 5 mm from outer edge 3. Central region 5 is a region surrounded by outer circumferential region 4. The carrier concentration is measured in central region 5. In other words, the carrier concentration in outer circumferential region 4 is not measured. Positions obtained by dividing a segment 7 which passes through the center of second main surface 12 and is parallel to first direction 101 into 12 substantially equal parts in central region 5, for example, serve as measurement positions. Similarly, positions obtained by dividing a segment 6 which passes through the center of second main surface 12 and is parallel to second direction 102 into 12 substantially equal parts serve as measurement positions. A point of intersection of these two straight lines is one of the measurement positions. As shown in FIG. 3, the carrier concentration is measured at the total of 25 measurement positions (hatched regions) in central region 5. An average value and a standard deviation of the carrier concentrations at the total of 25 measurement positions are calculated.

As shown in FIG. 2, silicon carbide layer 20 includes a surface layer region 29 and a bottom layer region 26. Surface layer region 29 is a region within 10 μm from second main surface 12 toward fourth main surface 14 in a direction perpendicular to second main surface 12. A depth of measurement is adjusted by an applied voltage. Bottom layer region 26 is a region sandwiched between surface layer region 29 and silicon carbide single-crystal substrate 10. The carrier concentration is measured in surface layer region 29. The measured data is plotted with $1/C^2$ as the vertical axis and V as the horizontal axis. The carrier concentration is estimated from the slope of a line of the measured data.

(Minute Pit)

Figure 4:
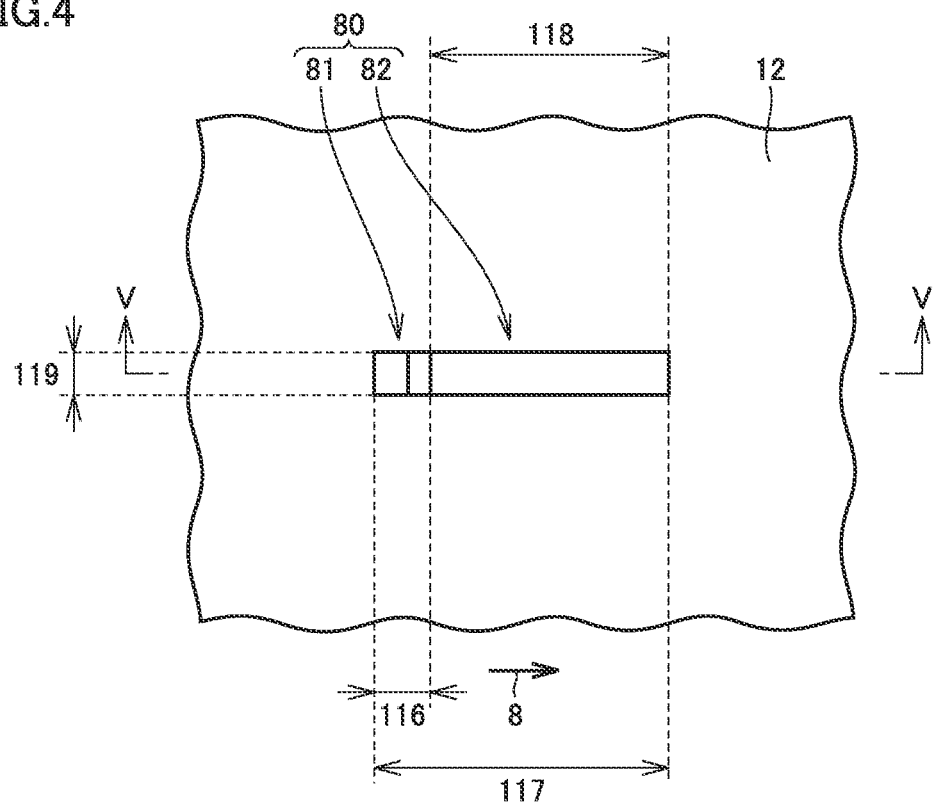
FIG. 4 is a schematic plan view showing the configuration of a minute pit according to the present embodiment.
Figure 5:
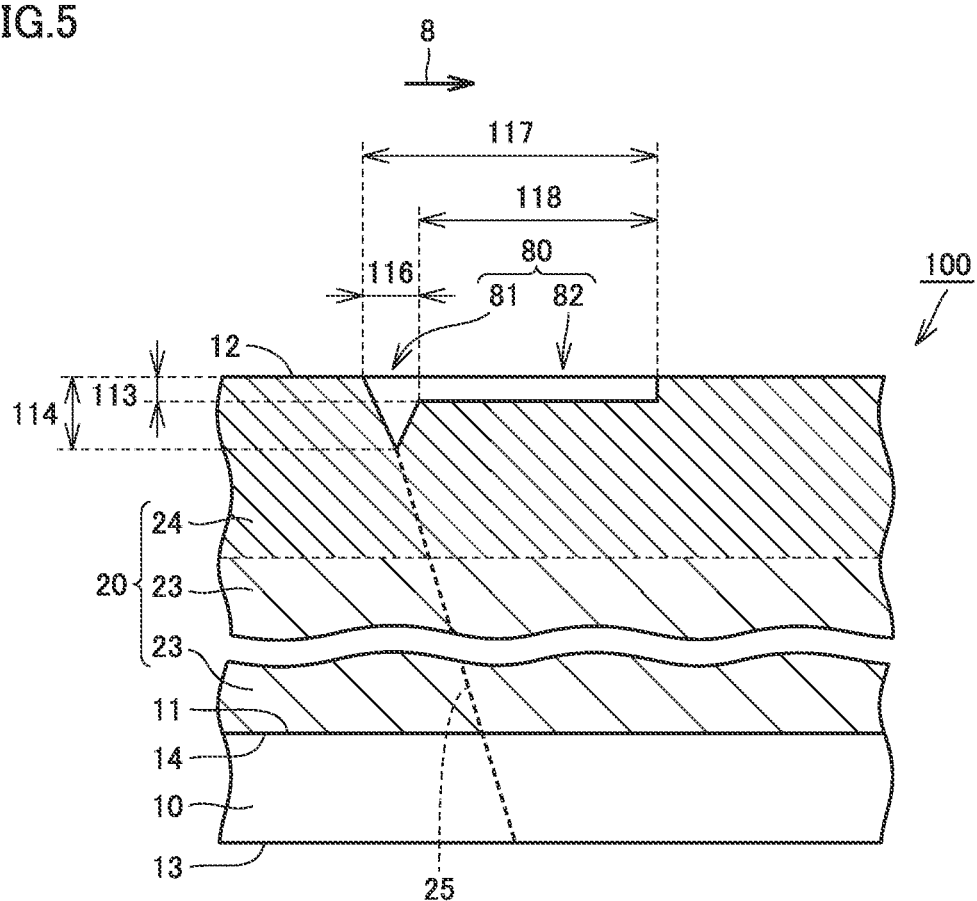
FIG. 5 is a schematic sectional view showing the configuration of the minute pit according to the present embodiment.

Next, the configuration of a minute pit (groove) is described. As shown in FIGS. 4 and 5, second main surface 12 has a groove 80. In plan view (a view seen in the direction perpendicular to second main surface 12), groove 80 extends in one direction along the direction parallel to second main surface 12. Specifically, groove 80 extends along a step-flow growth direction 8, which is along an off direction of an off angle relative to a (0001) plane. For example, groove 80 extends along a direction in the range of not more than ±5° relative to a <11-20> direction, or a direction in the range of not more than ±5° relative to a <01-10> direction.

As shown in FIG. 4, a width 117 in the aforementioned one direction of groove 80 is twice or more as large as, and preferably, five times or more as large as, a width 119 thereof in a direction perpendicular to the aforementioned one direction. Width 117 is not less than 15 μm and not more than 50 μm, and preferably not less than 25 μm and not more than 35 μm. Width 119 is not less than 1 μm and not more than 5 μm, and preferably not less than 2 μm and not more than 3 μm.

As shown in FIG. 5, groove 80 extends from a threading dislocation 25 (more specifically, a threading screw dislocation) present in silicon carbide layer 20, along step-flow growth direction 8 which is along the off direction of the off angle. More specifically, groove 80 includes a first groove portion 81 formed on threading dislocation 25, and a second groove portion 82 provided continuously with first groove portion 81 and extending from first groove portion 81 along step-flow growth direction 8.

First groove portion 81 is formed at one end portion (left end portion in FIG. 5) of groove 80 in step-flow growth direction 8. A maximum depth 114 of first groove portion 81 from second main surface 12 is not more than 10 nm. Maximum depth 114 is the maximum depth in the entire groove 80. A width 116 of first groove portion 81 is preferably not more than 1 μm, and more preferably not more than 0.5 μm.

As shown in FIG. 5, second groove portion 82 extends from its portion of connection with first groove portion 81 to the other end portion (right end portion in FIG. 5) opposite to the aforementioned one end portion. In other words, second groove portion 82 extends from first groove portion 81 along one direction 8 to the other end portion opposite to the one end portion. A depth 113 of second groove portion 82 from second main surface 12 is smaller than maximum depth 114 of first groove portion 81. More specifically, second groove portion 82 extends along step-flow growth direction 8 while maintaining depth 113 shallower than maximum depth 114 of first groove portion 81. Depth 113 is preferably not more than 3 nm, more preferably not more than 2 nm, and further preferably not more than 1 nm. A width 118 of second groove portion 82 is not less than 20 μm, for example, and preferably not less than 25 μm.

As shown in FIG. 5, a drift layer 20 may include a first layer 23 and a second layer 24. In a step of forming drift layer 20, epitaxial growth may be performed in a step forming first layer 23 under conditions different from those in a step of forming second layer 24. Specifically, a gas flow rate, a film thickness, temperature and the like may be different between the step forming first layer 23 and the step forming second layer 24.

(Carrot Defect)

Figure 6:
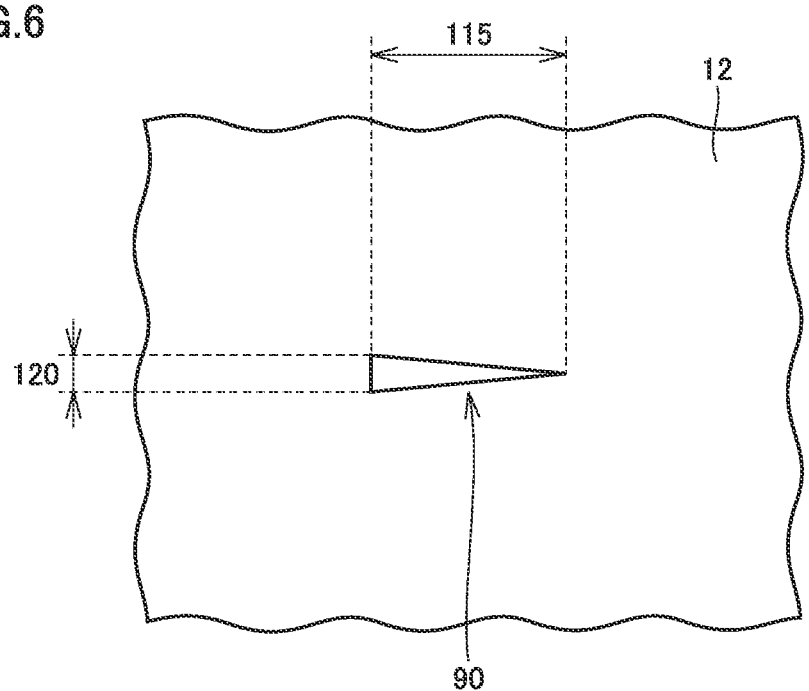
FIG. 6 is a schematic plan view showing the configuration of a carrot defect according to the present embodiment.

Next, the configuration of a carrot defect is described. As shown in FIG. 6, second main surface 12 has a carrot defect 90. Carrot defect 90 is a type of extended defects. An extended defect is a defect having a two-dimensional extent when viewed from a direction perpendicular to the surface of a silicon carbide layer. An extended defect may be an extended dislocation formed of two partial dislocations arising from a perfect dislocation, and a stacking fault in the form of a strip connecting these two partial dislocations, for example.

Carrot defect 90 has an elongate shape when viewed from the direction perpendicular to second main surface 12. A width 115 in a longitudinal direction of carrot defect 90 depends on the thickness of silicon carbide layer 20. Typically, width 115 is not less than 100 μm and not more than 500 μm. As shown in FIG. 6, a width 120 in a transverse direction of carrot defect 90 may decrease monotonously in the longitudinal direction of carrot defect 90. A maximum value of width 120 in the transverse direction is not less than 10 μm and not more than 100 μm, for example. Carrot defect 90 has a portion protruding from second main surface 12. The protruding portion has a height of not less than 0.1 μm and not more than 2 μm, for example.

A value obtained by dividing the number of carrot defects 90 by the number of grooves 80 (minute pits 80) is not more than 1/500. The value obtained by dividing the number of carrot defects 90 by the number of grooves 80 is preferably not more than 1/1000, and more preferably not more than 1/5000.

The density of carrot defects 90 in second main surface 12 is a value obtained by dividing the number of all carrot defects 90 in second main surface 12 by the area ($cm^2$) of second main surface 12. The density of carrot defects 90 may be not more than 1 $cm^{-2}$, for example. The density of carrot defects 90 is preferably not more than 0.5 $cm^{-2}$, and more preferably not more than 0.1 $cm^{-2}$.

Figure 7:
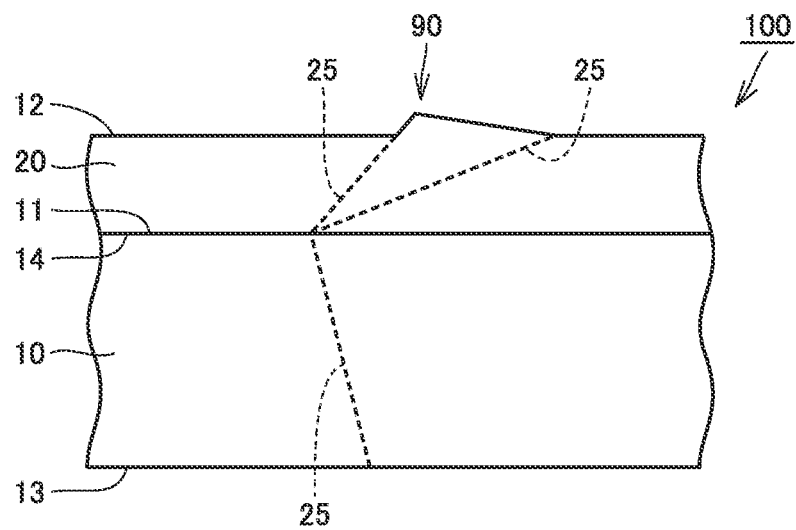
FIG. 7 is a schematic sectional view showing the configuration of the carrot defect according to the present embodiment.

As shown in FIG. 7, threading screw dislocation 25 present in silicon carbide single-crystal substrate 10 is bent at an interface between silicon carbide single-crystal substrate 10 and silicon carbide layer 20 (epitaxial layer), and thereby grows to be carrot defect 90. Thus, carrot defect 90 is not generated if threading screw dislocation 25 is stretched without being bent. As shown in FIG. 5, threading screw dislocation 25 stretched to second main surface 12 without being bent at the interface between silicon carbide single-crystal substrate 10 and silicon carbide layer 20 causes minute pit 80.

(Method of Measuring the Numbers of Minute Pits and Carrot Defects)

The numbers of "minute pits (grooves)" and "carrot defects" can be measured by observing second main surface 12 with a defect inspection device including a confocal differential interference microscope. As the defect inspection device including the confocal differential interference microscope, WASAVI series "SICA 6X" manufactured by Lasertec Corporation or the like can be used. The magnification of an objective lens is set at ×10. A threshold value of detection sensitivity of this defect inspection device is decided using a standard sample. Thus, this defect inspection device can be used to quantitatively evaluate the numbers of "minute pits" and "carrot defects" that have appeared at second main surface 12.

For example, central region 5 of second main surface 12 is divided into a plurality of observed areas. One observed area is a 1.3 mm×1.3 mm square region. Images of all observed areas are taken. The image of each observed area is processed with a prescribed method, to identify the minute pits and the carrot defects in the image. The number of minute pits and the number of carrot defects are calculated in each of the observed areas in central region 5, to determine the number of minute pits and the number of carrot defects in the entire central region 5. That the value obtained by dividing the number of carrot defects 90 by the number of grooves 80 (minute pits 80) is not more than 1/500 means that the value obtained by dividing the number of carrot defects by the number of minute pits is not more than 1/500 in all observed areas in central region 5.

(Apparatus of Manufacturing Silicon Carbide Epitaxial Substrate)

Next, the configuration of an apparatus 200 of manufacturing silicon carbide epitaxial substrate 100 according to the present embodiment is described.

Figure 8:
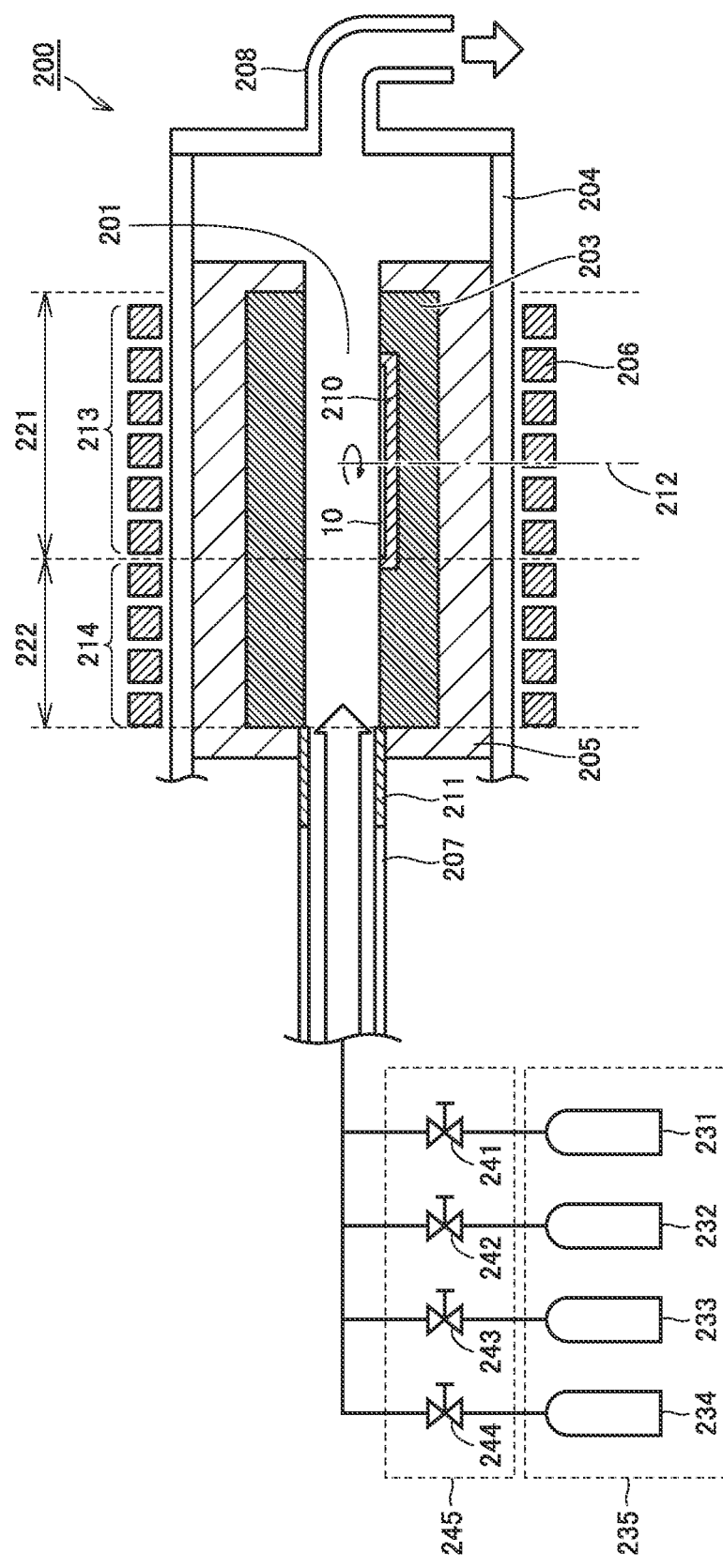
FIG. 8 is a partial schematic sectional view showing the configuration of an apparatus of manufacturing the silicon carbide epitaxial substrate according to the present embodiment.

As shown in FIG. 8, manufacturing apparatus 200 is a hot wall type lateral CVD (Chemical Vapor Deposition) apparatus, for example. Manufacturing apparatus 200 mainly has a reaction chamber 201, a gas supply unit 235, a control unit 245, a heating element 203, a quartz tube 204, a heat insulator 205, and an induction heating coil 206.

Heating element 203 has a cylindrical shape, for example, and forms reaction chamber 201 therein. Heating element 203 is made of graphite, for example. Heat insulator 205 surrounds the outer circumference of heating element 203. Heat insulator 205 is provided in quartz tube 204 so as to make contact with an inner circumferential surface of quartz tube 204. Induction heating coil 206 is wound along an outer circumference surface of quartz tube 204, for example. Induction heating coil 206 is configured to be able to supply an alternating current from an external power supply (not shown). Heating element 203 is thereby inductively heated. As a result, reaction chamber 201 is heated by heating element 203.

Reaction chamber 201 is a space formed by being surrounded by heating element 203. Silicon carbide single-crystal substrate 10 is disposed in reaction chamber 201. Reaction chamber 201 is configured to be able to heat silicon carbide single-crystal substrate 10. Reaction chamber 201 is provided with a susceptor plate 210 holding silicon carbide single-crystal substrate 10. Susceptor plate 210 is configured to be able to rotate around its rotation axis 212.

Manufacturing apparatus 200 further has a gas inlet port 207 and a gas outlet port 208. Gas outlet port 208 is connected to an air exhaust pump (not shown).

Arrows in FIG. 8 indicate a gas flow. Gas is introduced through gas inlet port 207 into reaction chamber 201, and exhausted through gas outlet port 208. A pressure in reaction chamber 201 is adjusted by a balance between an amount of supplied gas and an amount of exhausted gas.

Manufacturing apparatus 200 may further have a heating unit 211 located between gas inlet port 207 and heating element 203. Heating unit 211 is located upstream of heating element 203. Heating element 203 may be configured to be heated to about 1600 K, for example.

Gas supply unit 235 is configured to be able to supply a mixed gas including silane, ammonia, hydrogen, and propane, for example, to reaction chamber 201. Specifically, gas supply unit 235 may include a first gas supply unit 231, a second gas supply unit 232, a third gas supply unit 233, and a carrier gas supply unit 234.

First gas supply unit 231 is configured to be able to supply a first gas including carbon atoms. First gas supply unit 231 is a gas cylinder filled with the first gas, for example. The first gas is propane ($C_3H_8$) gas, for example. Second gas supply unit 232 is configured to be able to supply a second gas including silane gas. Second gas supply unit 232 is a gas cylinder filled with the second gas, for example. The second gas is silane ($SiH_4$) gas, for example.

Third gas supply unit 233 is configured to be able to supply a third gas including ammonia gas. Third gas supply unit 233 is a gas cylinder filled with the third gas, for example. The third gas is doping gas including N (nitrogen atoms). Ammonia gas is thermally decomposed more readily than nitrogen gas having a triple bond. It is expected that the use of ammonia gas will improve the in-plane uniformity of the carrier concentration. Carrier gas supply unit 234 is configured to be able to supply a carrier gas such as hydrogen. Carrier gas supply unit 234 is a gas cylinder filled with hydrogen, for example.

Control unit 245 is configured to be able to control a flow rate of the mixed gas supplied from gas supply unit 235 to reaction chamber 201. Specifically, control unit 245 may include a first gas flow rate control unit 241, a second gas flow rate control unit 242, a third gas flow rate control unit 243, and a carrier gas flow rate control unit 244. Each control unit may be a MFC (Mass Flow Controller), for example. Control unit 245 is disposed between gas supply unit 235 and gas inlet port 207. In other words, control unit 245 is disposed in a flow path connecting gas supply unit 235 and gas inlet port 207.

In manufacturing apparatus 200, reaction chamber 201 includes a first heating region 213 over a region where silicon carbide single-crystal substrate 10 is disposed, and a second heating region 214 located upstream of first heating region 213. As shown in FIG. 8, second heating region 214 is a region from an upstream-side boundary between heat insulator 205 and heating element 203 to an upstream-side end portion of the region where silicon carbide single-crystal substrate 10 is disposed, in a flow direction of the mixed gas (axial direction of reaction chamber 201). A boundary portion between second heating region 214 and first heating region 213 may be an upstream-side side face of a recess provided in susceptor plate 210. A downstream-side end portion of first heating region 213 may be a downstream-side boundary between heat insulator 205 and heating element 203.

In the axial direction of reaction chamber 201, the density of turns of induction heating coil 206 may be changed. The density of turns [count/m] is a number of windings of a coil per unit length in an axial direction of a device. For example, in second heating region 214, the density of turns of induction heating coil 206 on the upstream side may be higher than the density of turns of induction heating coil 206 on the downstream side, so as to allow effective thermal decomposition of ammonia on the upstream side.

Second heating region 214 may be configured to be able to be heated to a temperature equal to or higher than the decomposition temperature of ammonia. The decomposition temperature of ammonia is 500° C., for example. The temperature of a portion of heating element 203 that forms second heating region 214 is 1850 K, for example. In the flow direction of the mixed gas, a length 222 of second heating region 214 is not less than 60 mm. In the flow direction of the mixed gas, a length 221 of first heating region 213 may be greater than length 222 of second heating region 214.

(Method of Manufacturing Silicon Carbide Epitaxial Substrate)

Next, a method of manufacturing the silicon carbide epitaxial substrate according to the present embodiment is described.

First, a step of disposing a silicon carbide single-crystal substrate in a reaction chamber is performed. A silicon carbide single crystal having a polytype of 4H is manufactured by sublimation, for example. Then, the silicon carbide single crystal is sliced by a wire saw, for example, to prepare silicon carbide single-crystal substrate 10. This silicon carbide single crystal has a polytype of 4H—SiC, for example. The 4H—SiC has better electron mobility, dielectric breakdown electric field strength and the like than other polytypes. Silicon carbide single-crystal substrate 10 includes an n type impurity such as nitrogen. Silicon carbide single-crystal substrate 10 has n type conductivity, for example.

The surface of silicon carbide single-crystal substrate 10 is a plane tilted at an angle of not more than 4° from a {0001} plane, for example. The tilt direction is a <11-20> direction, for example. Silicon carbide single-crystal substrate 10 has a diameter of not less than 150 mm, for example. Then, silicon carbide single-crystal substrate 10 is disposed in reaction chamber 201. As shown in FIG. 8, silicon carbide single-crystal substrate 10 is disposed in the recess in susceptor plate 210.

Next, a step of forming a silicon carbide layer on the silicon carbide single-crystal substrate is performed. Specifically, manufacturing apparatus 200 described above is used to form silicon carbide layer 20 on silicon carbide single-crystal substrate 10 by epitaxial growth. For example, after the pressure in reaction chamber 201 is reduced from atmospheric pressure to about $1 \times 10^{-6}$ Pa, a temperature rise of silicon carbide single-crystal substrate 10 is started. In the course of the temperature rise, hydrogen ($H_2$) gas serving as the carrier gas is introduced into reaction chamber 201 from carrier gas supply unit 234. A flow rate of the hydrogen gas is adjusted by carrier gas flow rate control unit 244.

After the temperature of silicon carbide single-crystal substrate 10 reaches about 1600° C., for example, a source material gas, a dopant gas and a carrier gas are supplied to reaction chamber 201. Specifically, a mixed gas including silane, ammonia, hydrogen and propane is supplied to reaction chamber 201, whereby the respective gases are thermally decomposed to form silicon carbide layer 20 on silicon carbide single-crystal substrate 10.

For example, carrier gas flow rate control unit 244 is used to adjust the flow rate of the carrier gas (hydrogen) supplied to reaction chamber 201 to 100 slm. Second gas flow rate control unit 242 is used to adjust the flow rate of the silane gas supplied to reaction chamber 201 to 150 sccm. Third gas flow rate control unit 243 is used to adjust the flow rate of the ammonia gas to $1.1 \times 10^{-2}$ sccm. In this case, a value obtained by dividing the flow rate of silane by the flow rate of hydrogen is 0.15% in terms of percentage. A growth rate of silicon carbide layer 20 is 33 μm/h. In this manner, silicon carbide epitaxial substrate 100 including silicon carbide single-crystal substrate 10 and silicon carbide layer 20 (see FIG. 1) is manufactured.

In order to stretch threading screw dislocation 25 to second main surface 12 of silicon carbide layer 20 (epitaxial layer) as shown in FIG. 5, it is desired to adopt the following conditions. Specifically, the thickness of silicon carbide layer 20 is 15 μm, for example. The growth rate of silicon carbide layer 20 is 33 μm/h, for example. If first main surface 11 is 150 mm (6 inches), the in-plane temperature uniformity (the difference between maximum temperature and minimum temperature) in the surface of silicon carbide layer 20 is typically 13° C. The in-plane temperature uniformity is desirably not more than 15° C. The C/Si ratio is not less than 1.0 and not more than 1.1, for example.

(Method of Manufacturing Silicon Carbide Semiconductor Device)

Next, a method of manufacturing a silicon carbide semiconductor device 300 according to the present embodiment is described.

Figure 9:
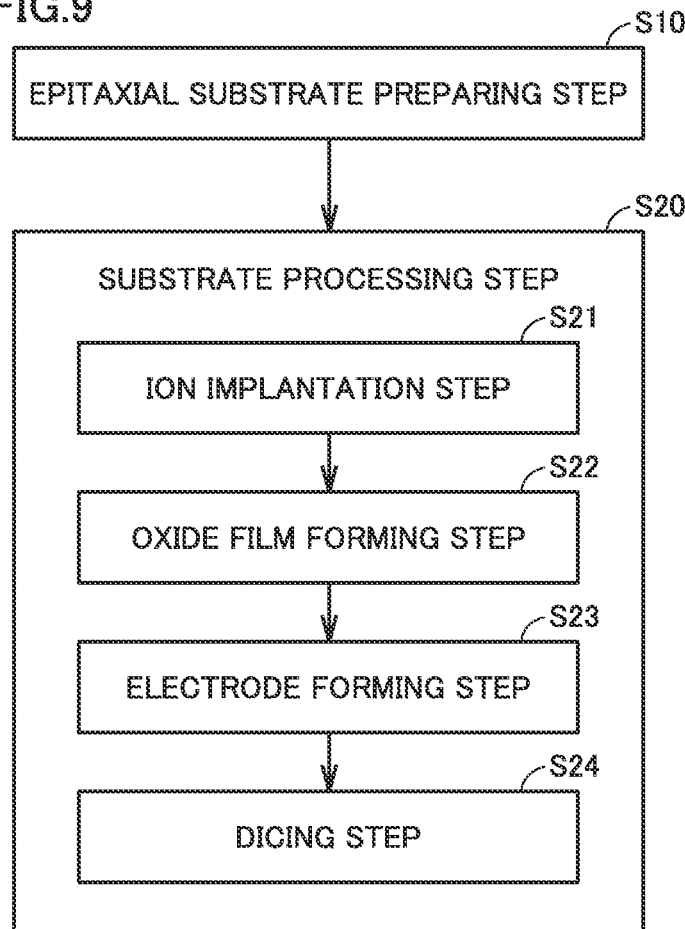
FIG. 9 is a flowchart schematically showing a method of manufacturing a silicon carbide semiconductor device according to the present embodiment.

The method of manufacturing the silicon carbide semiconductor device according to the present embodiment mainly has an epitaxial substrate preparing step (S10: FIG. 9) and a substrate processing step (S20: FIG. 9).

First, the epitaxial substrate preparing step (S10: FIG. 9) is performed. Specifically, silicon carbide epitaxial substrate 100 is prepared with the method of manufacturing the silicon carbide epitaxial substrate described above (see FIG. 1).

Next, the substrate processing step (S20: FIG. 9) is performed. Specifically, the silicon carbide epitaxial substrate is processed to manufacture a silicon carbide semiconductor device. The "processing" includes various types of processing such as ion implantation, heat treatment, etching, oxide film formation, electrode formation, and dicing. That is, the substrate processing step may include at least one of the types of processing including ion implantation, heat treatment, etching, oxide film formation, electrode formation, and dicing.

Described below is a method of manufacturing a MOSFET (Metal Oxide Semiconductor Field Effect Transistor) as an example of the silicon carbide semiconductor device. The substrate processing step (S20: FIG. 9) includes an ion implantation step (S21: FIG. 9), an oxide film forming step (S22: FIG. 9), an electrode forming step (S23: FIG. 9), and a dicing step (S24: FIG. 9).

Figure 10:
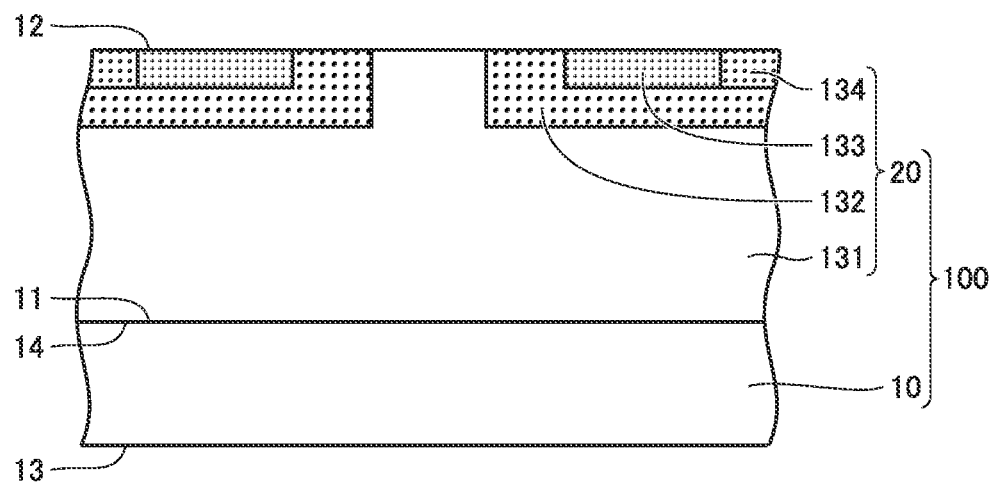
FIG. 10 is a schematic sectional view showing a first step of the method of manufacturing the silicon carbide semiconductor device according to the present embodiment.

First, the ion implantation step (S21: FIG. 9) is performed. A p type impurity such as aluminum (Al) is implanted into second main surface 12 on which a mask (not shown) with an opening has been formed. Consequently, a body region 132 having p type conductivity is formed. Then, an n type impurity such as phosphorus (P) is implanted into a prescribed position within body region 132. Consequently, a source region 133 having n type conductivity is formed. Then, a p type impurity such as aluminum is implanted into a prescribed position within source region 133. Consequently, a contact region 134 having p type conductivity is formed (see FIG. 10).

In silicon carbide layer 20, a portion other than body region 132, source region 133 and contact region 134 serves as a drift region 131. Source region 133 is separated from drift region 131 by body region 132. The ion implantation may be performed while silicon carbide epitaxial substrate 100 is heated to about not less than 300° C. and not more than 600° C. After the ion implantation, silicon carbide epitaxial substrate 100 is subjected to activation annealing. The activation annealing activates the impurities implanted into silicon carbide layer 20, to generate a carrier in each region. The activation annealing may be performed in an argon (Ar) atmosphere, for example. The activation annealing may be performed at a temperature of about 1800° C., for example. The activation annealing may be performed for a period of about 30 minutes, for example.

Figure 11:
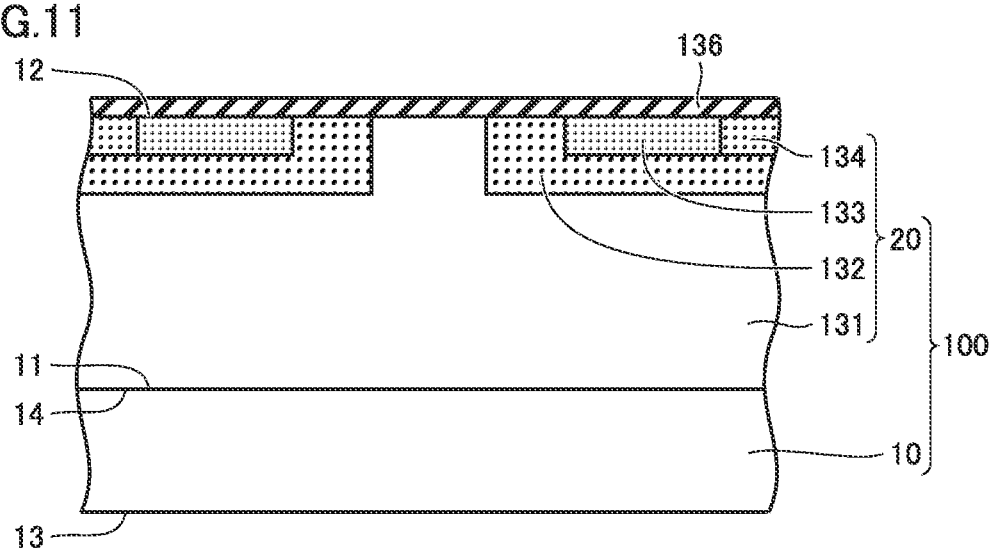
FIG. 11 is a schematic sectional view showing a second step of the method of manufacturing the silicon carbide semiconductor device according to the present embodiment.

Next, the oxide film forming step (S22: FIG. 9) is performed. Silicon carbide epitaxial substrate 100 is heated in an atmosphere including oxygen, for example, to form an oxide film 136 on second main surface 12 (see FIG. 11). Oxide film 136 is made of silicon dioxide ($SiO_2$), for example. Oxide film 136 functions as a gate insulating film. The thermal oxidation process may be performed at a temperature of about 1300° C., for example. The thermal oxidation process may be performed for a period of about 30 minutes, for example.

After oxide film 136 is formed, heat treatment may be further performed in a nitrogen atmosphere. For example, heat treatment may be performed in an atmosphere such as nitrogen monoxide (NO) or nitrous oxide ($N_2O$) at about 1100° C. for about one hour. Subsequently, heat treatment may be further performed in an argon atmosphere. For example, heat treatment may be performed in an argon atmosphere at about 1100 to 1500° C. for about one hour.

Next, the electrode forming step (S23: FIG. 9) is performed. A first electrode 141 is formed on oxide film 136. First electrode 141 functions as a gate electrode. First electrode 141 is formed by CVD, for example. First electrode 141 is made of polysilicon including an impurity and having conductivity, for example. First electrode 141 is formed at a position facing source region 133 and body region 132.

Next, an interlayer insulating film 137 is formed to cover first electrode 141. Interlayer insulating film 137 is formed by CVD, for example. Interlayer insulating film 137 is made of silicon dioxide, for example. Interlayer insulating film 137 is formed in contact with first electrode 141 and oxide film 136. Then, oxide film 136 and interlayer insulating film 137 at a prescribed position are removed by etching. Consequently, source region 133 and contact region 134 are exposed at oxide film 136.

A second electrode 142 is formed at this exposed portion by sputtering, for example. Second electrode 142 functions as a source electrode. Second electrode 142 is made of titanium, aluminum and silicon, for example. After second electrode 142 is formed, second electrode 142 and silicon carbide epitaxial substrate 100 are heated at a temperature of about 900 to 1100° C., for example. Consequently, second electrode 142 and silicon carbide epitaxial substrate 100 are brought into ohmic contact with each other. Then, a wiring layer 138 is formed in contact with second electrode 142. Wiring layer 138 is made of a material including aluminum, for example.

Next, a third electrode 143 is formed on third main surface 13. Third electrode 143 functions as a drain electrode. Third electrode 143 is made of an alloy including nickel and silicon, for example (NiSi, for example).

Figure 12:
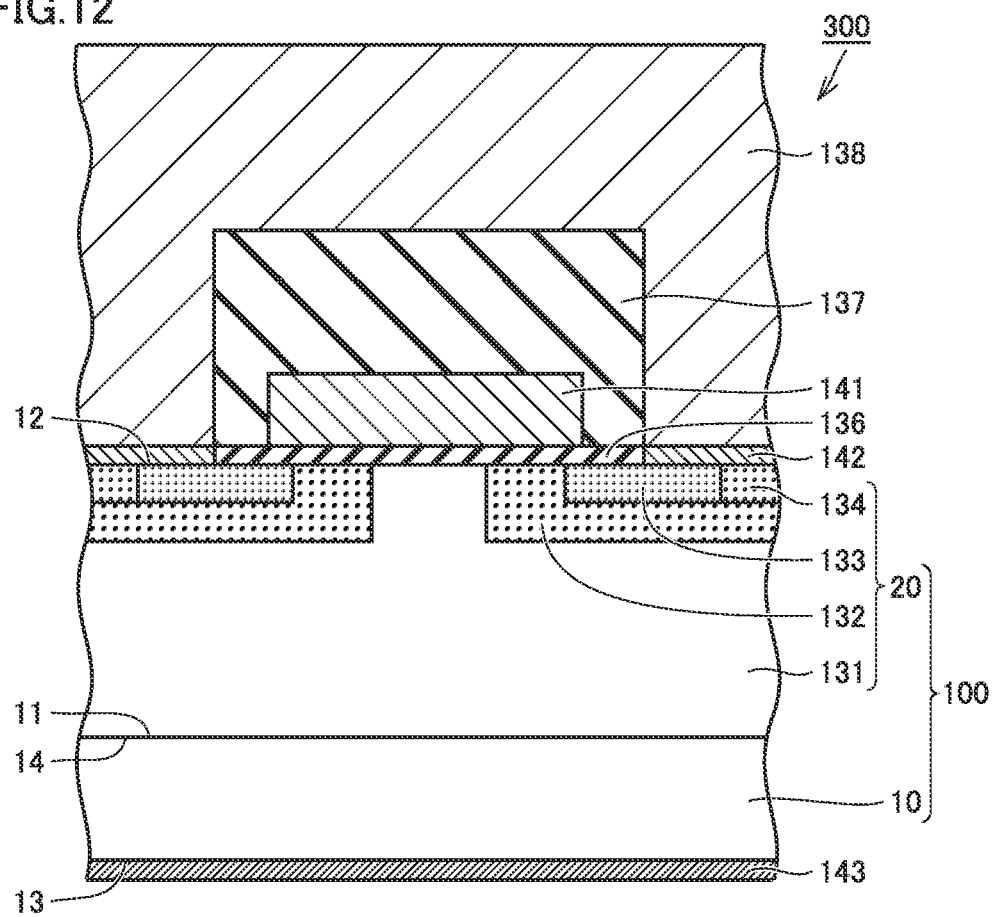
FIG. 12 is a schematic sectional view showing a third step of the method of manufacturing the silicon carbide semiconductor device according to the present embodiment.

Next, the dicing step (S24: FIG. 9) is performed. Silicon carbide epitaxial substrate 100 is diced along dicing lines, for example, to divide silicon carbide epitaxial substrate 100 into a plurality of semiconductor chips. In this manner, silicon carbide semiconductor device 300 is manufactured (see FIG. 12).

Although the method of manufacturing the silicon carbide semiconductor device according to the present disclosure has been described above with reference to a MOSFET as an example, the manufacturing method according to the present disclosure is not limited as such. The manufacturing method according to the present disclosure can be applied to various types of silicon carbide semiconductor devices such as an IGBT (Insulated Gate Bipolar Transistor), a SBD (Schottky Barrier Diode), a thyristor, a GTO (Gate Turn Off thyristor), and a PiN diode.

(Evaluation)
(Preparation of Samples)

Figure 13:
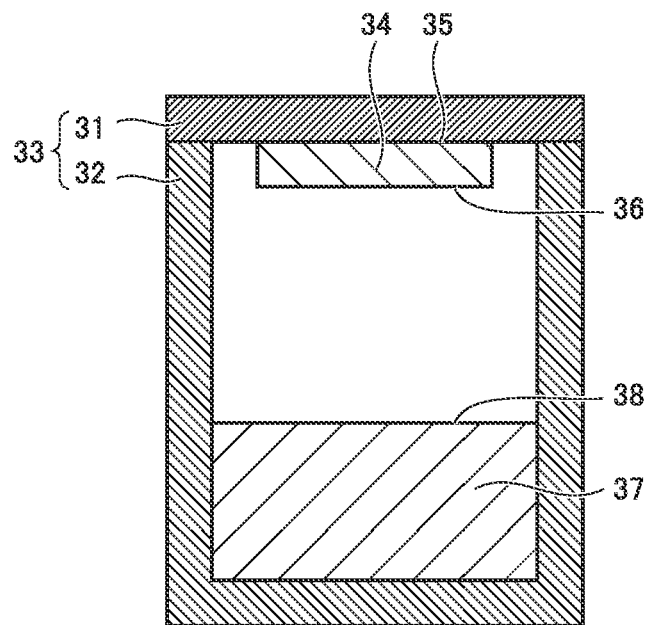
FIG. 13 is a schematic sectional view showing a first step of a method of manufacturing a silicon carbide single-crystal substrate according to the present embodiment.

First, a silicon carbide single-crystal ingot is manufactured by sublimation. Specifically, a crucible 33 having a pedestal 31 and an accommodation portion 32 is prepared (see FIG. 13). Then, a seed substrate 34 and a silicon carbide source material 37 are disposed in crucible 33. Silicon carbide source material 37 is disposed in accommodation portion 32. Silicon carbide source material 37 is polycrystalline silicon carbide in a solid state, for example. Seed substrate 34 is a substrate of a silicon carbide single crystal having a polytype of 4H, for example. The substrate has a diameter of 150 mm, for example. Seed substrate 34 has a surface 36 and a backside surface 35. Surface 36 is a plane angled off not more than 8° from a {0001} plane, for example. Backside surface 35 of seed substrate 34 is fixed to pedestal 31 with an adhesive, for example. Seed substrate 34 is attached to pedestal 31 such that surface 36 of seed substrate 34 faces a surface 38 of silicon carbide source material 37.

Crucible 33 is then heated. Crucible 33 is heated to about not less than 2000° C. and not more than 2400° C., for example. Crucible 33 is heated such that the temperature of silicon carbide source material 37 is higher than the temperature of seed substrate 34 in crucible 33. Then, a pressure in crucible 33 is reduced to about not less than 0.5 kPa and not more than 2 kPa. Consequently, silicon carbide source material 37 substantially starts to be sublimated, and starts to be recrystallized on surface 36 of seed substrate 34. In this manner, a silicon carbide single-crystal ingot 40 grows on surface 36 of seed substrate 34 (see FIG. 14). Silicon carbide single-crystal ingot 40 has a surface 41 facing silicon carbide source material 37, and a backside surface 42 facing seed substrate 34. Then, silicon carbide single-crystal ingot 40 is cut by a wire saw, for example, to provide a plurality of silicon carbide single-crystal substrates 10.

Next, silicon carbide layer 20 is formed on silicon carbide single-crystal substrate 10 by epitaxial growth with the method described in the above embodiment (see FIG. 8). In this manner, a plurality of silicon carbide epitaxial substrates (see FIG. 1) are prepared. It is noted that the growth of silicon carbide single-crystal ingot 40 by sublimation is performed twice. A sample 1 and a sample 2 are a plurality of silicon carbide epitaxial substrates 100 obtained from silicon carbide single-crystal ingot 40 after the first growth and the second growth, respectively.

(Measurement Method)

Next, the numbers of "minute pits" and "carrot defects" in second main surface 12 of each of the plurality of silicon carbide epitaxial substrates 100 are measured with the aforementioned method. Specifically, WASAVI series "SICA 6X" manufactured by Lasertec Corporation is used to measure the numbers of "minute pits" and "carrot defects" in central region 5 other than outer circumferential region 4 within 5 mm from outer edge 3 of second main surface 12. The magnification of an objective lens is set at ×10. Central region 5 is divided into a plurality of observed areas. Each of the plurality of observed areas is a 1.3 mm×1.3 mm square region.

(Measurement Results)

Figure 15:
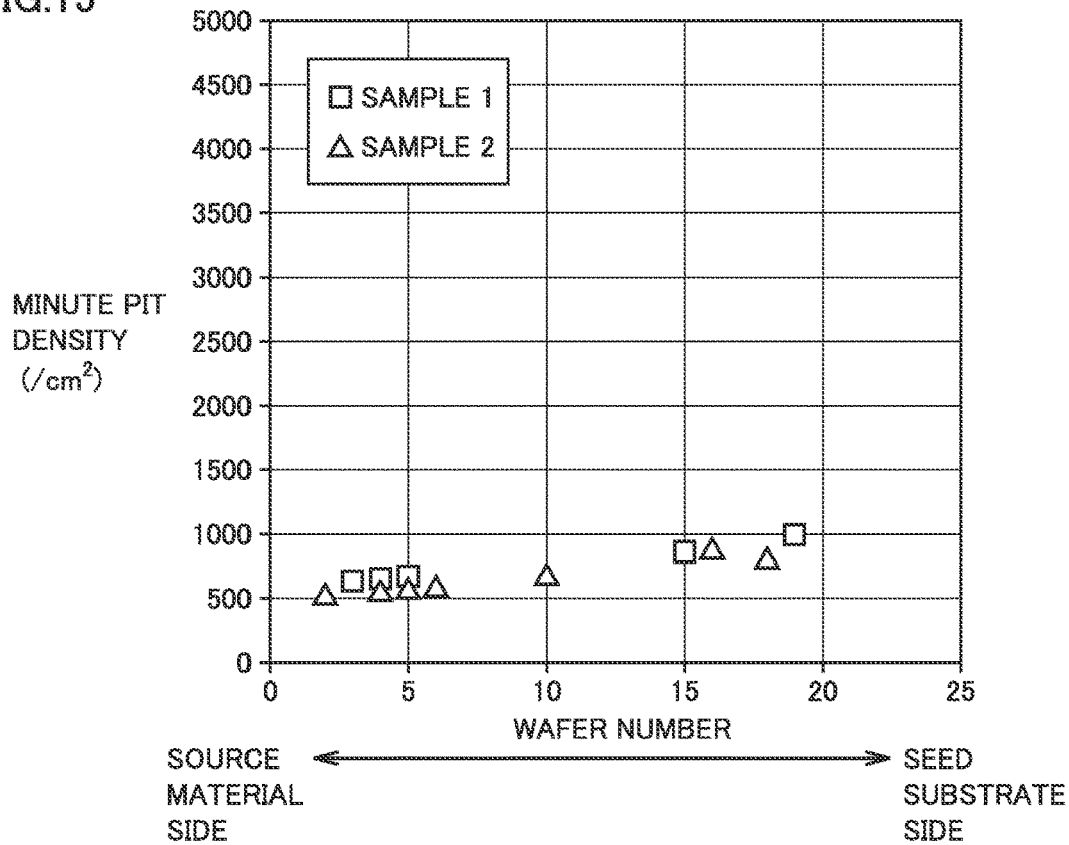
FIG. 15 is a diagram showing relation between a minute pit density in a second main surface of the silicon carbide single-crystal substrate and a wafer number of silicon carbide single-crystal substrates.

FIG. 15 is a diagram showing relation between the number of minute pits 80 in second main surface 12 and a wafer number of silicon carbide epitaxial substrates 100. As shown in FIG. 15, the density of minute pits is not more than 1000 $cm^{-2}$ in silicon carbide epitaxial substrates 100 of all wafer numbers. It is shown that silicon carbide epitaxial substrates 100 having a wafer number of 10 or less tend to be lower in the density of minute pits than silicon carbide epitaxial substrates 100 having a wafer number greater than 10.

Figure 16:
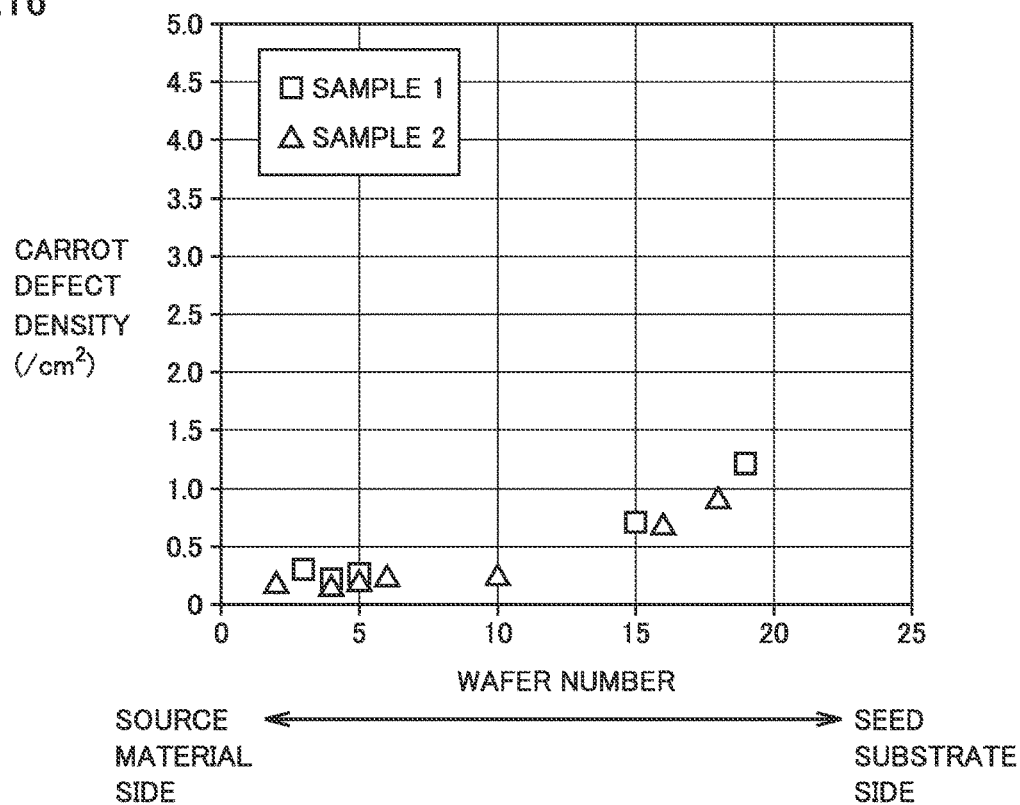
FIG. 16 is a diagram showing relation between a carrot defect density in the second main surface of the silicon carbide single-crystal substrate and a wafer number of silicon carbide single-crystal substrates.

FIG. 16 is a diagram showing relation between the number of carrot defects 90 in second main surface 12 and a wafer number of silicon carbide epitaxial substrates 100. As shown in FIG. 16, the density of carrot defects is not more than 1.2 $cm^{-2}$ in silicon carbide epitaxial substrates 100 of all wafer numbers. It is shown that silicon carbide epitaxial substrates 100 having a wafer number of 10 or less tend to be lower in the density of carrot defects than silicon carbide epitaxial substrates 100 having a wafer number greater than 10. A value obtained by dividing the number of carrot defects by the number of minute pits is not more than 1/500 in all of silicon carbide epitaxial substrates 100.

Figure 14:
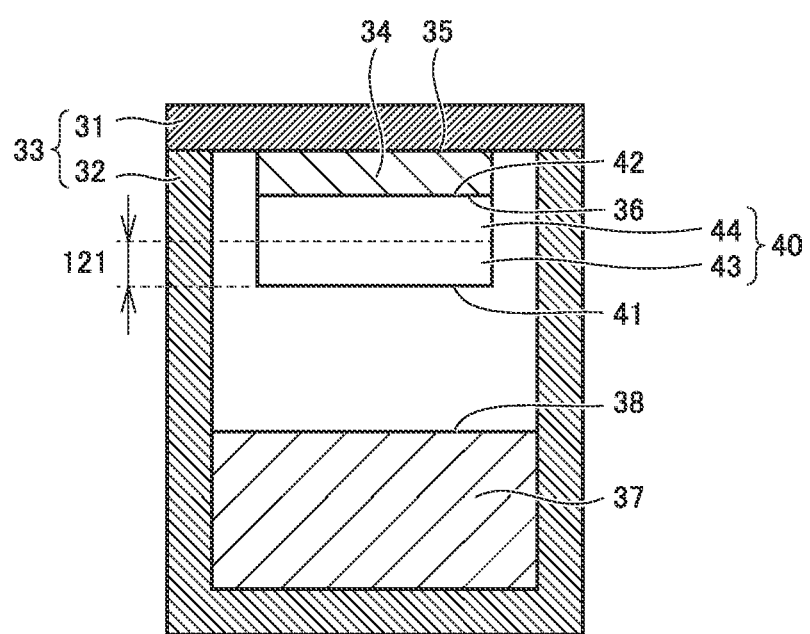
FIG. 14 is a schematic sectional view showing a second step of the method of manufacturing the silicon carbide single-crystal substrate according to the present embodiment.

It is noted that each of silicon carbide epitaxial substrates 100 having a wafer number of 10 or less is a substrate removed from a lower region 43 including surface 41 of silicon carbide single-crystal ingot 40 (see FIG. 14). Lower region 43 is a portion facing surface 38 of silicon carbide source material 37. A thickness 121 of lower region 43 is about from 10 mm to 30 mm, for example. By way of example, thickness 121 of lower region 43 is about 10 mm. In other words, lower region 43 is a portion within 10 mm from surface 41 of silicon carbide single-crystal ingot 40. Conversely, each of silicon carbide epitaxial substrates 100 having a wafer number greater than 10 is a substrate removed from an upper region 44 of silicon carbide single-crystal ingot 40. Upper region 44 is a portion facing seed substrate 34.

From the above results, it was confirmed that the number of minute pits and the number of carrot defects could be reduced in silicon carbide epitaxial substrate 100 using silicon carbide single-crystal substrate 10 removed from lower region 43 closer to surface 41 of silicon carbide single-crystal ingot 40, as compared to silicon carbide epitaxial substrate 100 using silicon carbide single-crystal substrate 10 removed from upper region 44 closer to backside surface 42 of silicon carbide single-crystal ingot 40.

It should be understood that the embodiments disclosed herein are illustrative and non-restrictive in every respect. The scope of the present invention is defined by the terms of the claims, rather than the embodiments described above, and is intended to include any modifications within the scope and meaning equivalent to the terms of the claims.

REFERENCE SIGNS LIST 1 first flat; 2 curvature portion; 3 outer edge; 4 outer circumferential region; 5 central region; 6, 7 segment; 8 step-flow growth direction (one direction); 10 silicon carbide single-crystal substrate; 11 first main surface; 12 second main surface; 13 third main surface; 14 fourth main surface (surface); 20 silicon carbide layer; 23 first layer; 24 second layer; 25 threading dislocation (threading screw dislocation); 26 bottom layer region; 29 surface layer region; 31 pedestal; 32 accommodation portion; 33 crucible; 34 seed substrate; 35, 42 backside surface; 36, 38, 41 surface; 37 silicon carbide source material; 40 silicon carbide single-crystal ingot; 43 lower region; 44 upper region; 80 minute pit (groove); 81 first groove portion; 82 second groove portion; 90 carrot defect; 100 silicon carbide epitaxial substrate; 101 first direction; 102 second direction; 111 maximum diameter; 131 drift region; 132 body region; 133 source region; 134 contact region; 136 oxide film; 137 interlayer insulating film; 138 wiring layer; 141 first electrode; 142 second electrode; 143 third electrode; 200 manufacturing apparatus; 201 reaction chamber; 203 heating element; 204 quartz tube; 205 heat insulator; 206 induction heating coil; 207 gas inlet port; 208 gas outlet port; 210 susceptor plate; 211 heating unit; 212 rotation axis; 213 first heating region; 214 second heating region; 231 first gas supply unit; 232 second gas supply unit; 233 third gas supply unit; 234 carrier gas supply unit; 235 gas supply unit; 241 first gas flow rate control unit; 242 second gas flow rate control unit; 243 third gas flow rate control unit; 244 carrier gas flow rate control unit; 245 control unit; 300 silicon carbide semiconductor device.

The invention claimed is:

1. A silicon carbide epitaxial substrate comprising:
  a silicon carbide single-crystal substrate including a first main surface; and
  a silicon carbide layer on the first main surface,
  the silicon carbide layer including a second main surface opposite to a surface thereof in contact with the silicon carbide single-crystal substrate,
  an average value of carrier concentration in the silicon carbide layer being not less than $1 \times 10^{15}$ $cm^{-3}$ and not more than $5 \times 10^{16}$ $cm^{-3}$,
  in-plane uniformity of the carrier concentration being not more than 2%, the second main surface having
grooves extending in one direction along the second main surface, a width of each of the grooves in the one direction being twice or more as large as a width thereof in a direction perpendicular to the one direction, and a maximum depth of each of the grooves from the second main surface being not more than 10 nm, and
one or more carrot defects,
a value obtained by dividing a number of the one or more carrot defects by a number of the grooves being not more than 1/500,
the silicon carbide single-crystal substrate having a polytype of 4H-SiC.

2. The silicon carbide epitaxial substrate according to claim 1, wherein
each of the grooves includes a first groove portion and a second groove portion provided continuously with the first groove portion,
the first groove portion is at one end portion of each of the grooves in the one direction, and
the second groove portion extends from the first groove portion along the one direction to the other end portion opposite to the one end portion, and has a depth from the second main surface which is smaller than a maximum depth of the first groove portion.

3. The silicon carbide epitaxial substrate according to claim 1, wherein the value is not more than 1/1000.

4. The silicon carbide epitaxial substrate according to claim 3, wherein the value is not more than 1/5000.

5. The silicon carbide epitaxial substrate according to claim 1, wherein a density of the carrot defects in the second main surface is not more than 1 $cm^{-2}$.

6. The silicon carbide epitaxial substrate according to claim 5, wherein the density is not more than 0.5 $cm^{-2}$.

7. The silicon carbide epitaxial substrate according to claim 6, wherein the density is not more than 0.1 $cm^{-2}$.

8. A method of manufacturing a silicon carbide semiconductor device, comprising:
preparing the silicon carbide epitaxial substrate according to claim 1; and
processing the silicon carbide epitaxial substrate.

9. The silicon carbide epitaxial substrate according to claim 1,
wherein the first main surface is a plane tilted in a<11-20>direction at an angle of not more than 4° from a {0001} plane.

10. The silicon carbide epitaxial substrate according to claim 1, wherein the silicon carbide single-crystal substrate includes an n type impurity.

11. The silicon carbide epitaxial substrate according to claim 1, wherein the silicon carbide layer includes an n type impurity.

12. The silicon carbide epitaxial substrate according to claim 1, wherein
a concentration of an n type impurity in the silicon carbide layer is lower than a concentration of the n type impurity in the silicon carbide single-crystal substrate.

* * * * *